United States Patent
Abe

(10) Patent No.: US 7,183,852 B2
(45) Date of Patent: Feb. 27, 2007

(54) DIFFERENTIAL AMPLIFYING METHOD AND APPARATUS OPERABLE WITH A WIDE RANGE INPUT VOLTAGE

(75) Inventor: Hirohisa Abe, Osaka-fu (JP)

(73) Assignee: Ricoh Company, Ltd., Tokyo (JP)

( * ) Notice: Subject to any disclaimer, the term of this patent is extended or adjusted under 35 U.S.C. 154(b) by 120 days.

(21) Appl. No.: 11/103,758

(22) Filed: Apr. 12, 2005

(65) Prior Publication Data
US 2006/0226908 A1 Oct. 12, 2006

(30) Foreign Application Priority Data
Apr. 12, 2004 (JP) .............................. 2004-116766

(51) Int. Cl.
*H03F 3/45* (2006.01)
(52) U.S. Cl. ...................... 330/257; 330/253
(58) Field of Classification Search ................ None
See application file for complete search history.

(56) References Cited

U.S. PATENT DOCUMENTS

| | | | |
|---|---|---|---|
| 4,554,515 A * | 11/1985 | Burson et al. ............. 330/257 |
| 5,650,753 A * | 7/1997 | Ling .......................... 330/257 |
| 6,031,780 A | 2/2000 | Abe ........................... 365/277 |
| 7,057,463 B2 * | 6/2006 | Wakii et al. ............... 330/257 |
| 2004/0174149 A1 | 9/2004 | Agari et al. ............... 323/271 |

FOREIGN PATENT DOCUMENTS

| | | |
|---|---|---|
| JP | 63-67905 | 3/1988 |
| JP | 6-18309 | 3/1994 |

* cited by examiner

*Primary Examiner*—Khanh Van Nguyen
(74) *Attorney, Agent, or Firm*—Cooper & Dunham LLP

(57) ABSTRACT

A differential amplifying apparatus includes first and second differential transistor pairs of different polarities operated by different constant currents, and first to sixth current mirror circuits. The second, third, fifth, and sixth current mirror circuits are connected to an output terminal. The first, second, and sixth current mirror circuits receive a first power supply voltage, and the third, fourth, and fifth current mirror circuits receive a second power supply voltage. The first and second current mirror circuits respectively output mirror currents based on respective corresponding currents flowing through the first differential transistor pair. The third current mirror circuit outputs a current input from the first current mirror circuit. The fourth and fifth current mirror circuits respectively output mirror currents based on respective corresponding currents flowing through the second differential transistor pair. The sixth current mirror circuit outputs a current input from the fourth current mirror circuit.

17 Claims, 5 Drawing Sheets

DIFFERENTIAL AMPLIFYING METHOD AND APPARATUS OPERABLE WITH A WIDE RANGE INPUT VOLTAGE

BACKGROUND

1. Field

This patent specification relates to a method and apparatus for differential amplification used in an integrated circuit, and more particularly to a method and apparatus for differential amplification operable at a voltage of a relatively wide range.

2. Discussion of the Background

Background differential amplifier circuits generally used are illustrated in FIGS. 1 and 2. A differential amplifier circuit 100 of FIG. 1 includes a differential transistor pair D101 formed by two N-channel transistors M1 and M2. Meanwhile, a differential amplifier circuit 200 of FIG. 2 includes a differential transistor pair D201 formed by two P-channel transistors M3 and M4. In each of the differential amplifier circuits 100 and 200, a constant current source CCS101 outputs a constant current ia. Further, a high-potential power supply voltage V1 is input in an input terminal IN1, and a low-potential power supply voltage V2 is input in an input terminal IN2. An output voltage Vout is output from an output terminal Vout.

An input voltage for operating the differential amplifier circuits is limited in range due to threshold characteristics of the transistors. For example, the differential amplifier circuit 100 of FIG. 1 operates at an input voltage in a range from approximately 1 volt to a high-potential power supply voltage V1. On the other hand, the differential amplifier circuit 200 of FIG. 2 operates at an input voltage in a range from a low-potential power supply voltage V2 (e.g., an earth termination voltage) to a voltage approximately 1 volt lower than the high-potential power supply voltage V1. Meanwhile, as illustrated in FIG. 3, Japanese Examined Patent Publication No. 06-018309, for example, discloses another differential amplifier circuit which stably operates at an input voltage in a relatively wide range.

The differential amplifier circuit 300 of FIG. 3 includes a constant current source CCS301 for outputting the constant current ia and a constant current source CCS302 for outputting a constant current ib. The differential amplifier circuit 300 of FIG. 3 further includes a differential transistor pair D302 formed by P-channel MOS (metal-oxide semiconductor) transistors (hereinafter referred to as PMOS transistors) M311 and M312. The differential transistor pair D302 corresponds to the differential amplifier circuit 200 of FIG. 2. Furthermore, the differential amplifier circuit 300 includes another differential transistor pair D301 formed by N-channel MOS transistors (hereinafter referred to as NMOS transistors) M302 and M303, an NMOS transistor M301 serving as a constant current source, and a current mirror circuit CM301 formed by PMOS transistors M304 and M305, which outputs a current approximately equal or proportional in amount to a current flowing through the NMOS transistor M302 to a drain of the PMOS transistor M312. The NMOS transistor M302 of the differential transistor pair D301 and the PMOS transistor M311 of the differential transistor pair D302 are respectively connected to an input terminal IN3. Meanwhile, the. NMOS transistor M303 of the differential transistor pair D301 and the PMOS transistor M312 of the differential transistor pair D302 are respectively connected to an input terminal IN4.

The differential amplifier circuit 300 further includes a current mirror circuit CM302 formed by PMOS transistors M306 and M307, which outputs a current equal or proportional in amount to a current flowing through the NMOS transistor M303 to a drain of the PMOS transistor M311. Furthermore, the differential amplifier circuit 300 includes an NMOS transistor M321, which has a source connected to a connection point between a source of the NMOS transistor M302 and a source of the NMOS transistor M303, and a gate for receiving input of a predetermined reference voltage Vr.

In addition, the differential amplifier circuit 300 includes a current mirror circuit CM303 formed by PMOS transistors M322 and M310, which serves as a constant current source for the differential transistor pair D302 (i.e., the differential amplifier circuit corresponding to the differential amplifier circuit 200 of FIG. 2). Specifically, the current mirror circuit CM303 outputs a current approximately equal or proportional in amount to the current flowing through the NMOS transistor M321 to respective sources of the PMOS transistors M111 and M112 which form the differential transistor pair D302.

In the differential amplifier circuit 300, when an input common mode voltage (i.e., an average between a voltage input in the input terminal IN3 and a voltage input in the input terminal IN4) is close to the earth termination voltage, the NMOS transistors M302 and M303 are both turned off, and a current flowing through the NMOS transistor M301 flows into the NMOS transistor M321. Then, the current passes through the current mirror circuit CM303 including the PMOS transistors M322 and M310 and flows into each of the PMOS transistors M311 and M312 of the differential transistor pair D302. The PMOS transistor M310 of the current mirror circuit CM303 serves as a constant current source for the PMOS transistors M311 and M312. A half of a current output from the PMOS transistor M310 flows into the PMOS transistor M311, and the other half of the current flows into the PMOS transistor M312. The PMOS transistors M311 and M312 together serve as an amplifier circuit connected to a load formed by NMOS transistors M313 and M314.

In the differential amplifier circuit 300, when the input common mode voltage increases, a current starts to flow into each of the NMOS transistors M302 and M303. Then, the current flowing into the NMOS transistor M321 decreases by an amount equal to an amount of a current flowed into the NMOS transistors M302 and M303. As a result, the current output from the PMOS transistor M310 also decreases. A current approximately equal or proportional in amount to the current flowing through the NMOS transistor M302 is output from the PMOS transistors M305 of the current mirror circuit CM301 and then is combined with a current output from the PMOS transistor M312. Accordingly, an amount of the thus combined currents is equal to a half amount of the current output from the NMOS transistor M301. Similarly, a current approximately equal or proportional in amount to the current flowing through the NMOS transistor M303 is output from the PMOS transistors M307 of the current mirror circuit CM302 and then is combined with a current output from the PMOS transistor M311. Accordingly, an amount of the thus combined currents is equal to the half amount of the current output from the NMOS transistor M301.

If the input common mode voltage further increases and exceeds the reference voltage Vr input in the gate of the NMOS transistor M321, the NMOS transistor M321 is turned off, and all of currents supplied by the NMOS transistor M301 flow into the NMOS transistors M302 and M303. As described above, the current approximately equal or proportional in amount to the current flowing through the NMOS transistor M302 is output from the current mirror circuit CM301 and combined with the current output from the PMOS transistor M312. Meanwhile, the current approximately equal or proportional in amount to the current flowing through the NMOS transistor M303 is output from the current mirror circuit CM302 and combined with the current output from the PMOS transistor M311. Accordingly, the PMOS transistors M311 and M312 together serve as the amplifier circuit connected to the load formed by the NMOS transistors M313 and M314. The operation described above is observed in the differential amplifier circuit 300, when the input common mode voltage is equal to or lower than the high-potential power supply voltage V1. Further, a sum of currents flowing through the NMOS transistors M313 and M314, which together form the load, is equal in amount to the current flowing through the NMOS transistor M301. As a result, fluctuation in current gain caused by a difference in input voltages is reduced.

The differential amplifier circuit 300 of FIG. 3 includes both of the differential PMOS transistor pair and the differential NMOS transistor pair. A drain of either one of the differential PMOS transistor pair and the differential NMOS transistor pair is used for outputting the output voltage Vout. For example, in the differential amplifier circuit 300, a drain of the PMOS transistor M311 is used for outputting the output voltage Vout. However, the upper limit of a drain voltage of the PMOS transistor M311 is equal to a voltage higher than the input voltage input in the input terminal IN3 of the PMOS transistor M311 by a threshold voltage of the PMOS transistor M311. As a result, the differential amplifier circuit 300 needs to include an output circuit or an amplifier circuit so as to increase a range of the output voltage Vout. In the differential amplifier circuit 300 thus configured, the range of the output voltage output from the drain of the PMOS transistor M311 varies depending on the input voltage. Also, due to configurations of the output circuit and the amplifier circuit provided at a following stage, currents for driving the output terminal OUT are different between when the output voltage Vout rises and when the output voltage Vout falls. As a result, rise and fall of an output signal vary depending on the input voltage, causing delay time. This causes a difference between the rising time and the falling time of the output signal.

SUMMARY

This patent specification describes a differential amplifying apparatus. In one example, a differential amplifying apparatus includes first and second differential transistor pairs and first to sixth current mirror circuits. The first differential transistor pair includes two transistors of a first polarity configured to be operated by a first predetermined constant current. The second differential transistor pair includes two transistors of a second polarity configured to be operated by a second predetermined constant current. The first current mirror circuit is configured to receive a first power supply voltage and output a current approximately equal or proportional in amount to a current flowing through one transistor of the first differential transistor pair. The second current mirror circuit is configured to be connected to an output terminal, receive the first power supply voltage, and output a current approximately equal or proportional in amount to a current flowing through the other transistor of the first differential transistor pair. The third current mirror circuit is configured to be connected to the output terminal, receive a second power supply voltage, and output a current input from the first current mirror circuit. The fourth current mirror circuit is configured to receive the second power supply voltage and output a current approximately equal or proportional in amount to a current flowing through one transistor of the second differential transistor pair. The fifth current mirror circuit is configured to be connected to the output terminal, receive the second power supply voltage, and output a current approximately equal or proportional in amount to a current flowing through the other transistor of the second differential transistor pair. The sixth current mirror circuit is configured to be connected to the output terminal, receive the first power supply voltage, and output a current input from the fourth current mirror circuit.

Further, this patent specification described another differential amplifying apparatus. In one example, this differential amplifying apparatus includes first to fourth input terminals, an output terminal, first and second differential transistor pairs, and first to sixth current mirror circuits. The first input terminal is configured to receive a first power supply voltage, and the second input terminal is configured to receive a second power supply voltage. The output terminal is configured to output a differential amplified voltage. The first differential transistor pair is configured to be operated by a first predetermined constant current, and includes a first transistor of a first polarity having a gate connected to the third input terminal, and a second transistor of the first polarity having a gate connected to the fourth input terminal. The second differential transistor pair is configured to be operated by a second predetermined constant current, and includes a third transistor of a second polarity having a gate connected to the third input terminal, and a fourth transistor of the second polarity having a gate connected to the fourth input terminal. The first current mirror circuit is configured to receive the first power supply voltage and output a current approximately equal or proportional in amount to a current flowing through the first transistor. The second current mirror circuit is configured to be connected to the output terminal, receive the first power supply voltage, and output a current approximately equal or proportional in amount to a current flowing through the second transistor. The third current mirror circuit is configured to be connected to the output terminal, receive the second power supply voltage, and output a current input from the first current mirror circuit. The fourth current mirror circuit is configured to receive the second power supply voltage and output a current approximately equal or proportional in amount to a current flowing through the third transistor. The fifth current mirror circuit is configured to be connected to the output terminal, receive the second power supply voltage, and output a current approximately equal or proportional in amount to a current flowing through the fourth transistor. The sixth current mirror circuit is configured to be connected to the output terminal, receive the first power supply voltage, and output a current input from the fourth current mirror circuit.

The differential amplifying apparatus may further include a second constant current source including a reference voltage source, a transistor of the first polarity, and a current mirror circuit. The reference voltage source may be configured to generate and output a predetermined reference voltage. The transistor of the first polarity may include a gate configured to receive the predetermined reference voltage, and a source connected to respective sources of the first and second transistors. The current mirror circuit may be configured to receive the first power supply voltage, and include an input terminal connected to a drain of the transistor of the first polarity, and an output terminal connected to a connection point connecting respective sources of the third and fourth transistors.

In the differential amplifying apparatus, the predetermined reference voltage output from the reference voltage source may be set to be within a range of voltages input in the third and fourth input terminals to pass currents through each of the first and second differential transistor pairs. Preferably, a total operating current is substantially constant and is approximately equal to the first predetermined constant current.

A preferred embodiment of the differential amplifying apparatus operates in a range from approximately the first power supply voltage to approximately the second power supply voltage, and the range does not vary according to an input voltage of the differential amplifying apparatus. In addition, in the preferred embodiment, a rise time of an output voltage of the differential amplifying apparatus is approximately equal to a fall time of the output voltage.

This patent specification further describes a differential amplifying method. In one example, a differential amplifying method includes: providing a first differential transistor pair including two transistors of a first polarity, and a second differential transistor pair including two transistors of a second polarity; providing first to sixth current mirror circuits; connecting the second, third, fifth, and sixth current mirror circuits to an output terminal; supplying a first predetermined constant current to the first differential transistor pair; supplying a second predetermined constant current to the second differential transistor pair; inputting a first power supply voltage in the first, second, and sixth current mirror circuits; inputting a second power supply voltage in the third, fourth, and fifth current mirror circuits; causing the first current mirror circuit to output a current approximately equal or proportional in amount to a current flowing through one transistor of the first differential transistor pair; causing the second current mirror circuit to output a current approximately equal or proportional in amount to a current flowing through the other transistor of the first differential transistor pair; causing the third current mirror circuit to output a current input from the first current mirror circuit; causing the fourth current mirror circuit to output a current approximately equal or proportional in amount to a current flowing through one transistor of the second differential transistor pair; causing the fifth current mirror circuit to output a current approximately equal or proportional in amount to a current flowing through the other transistor of the second differential transistor pair; and causing the sixth current mirror circuit to output a current input from the fourth current mirror circuit.

Further, this patent specification describes another differential amplifying method. In one example, this differential amplifying method includes: providing a first input terminal configured to receive a first power supply voltage, a second input terminal configured to receive a second power supply voltage, a third input terminal, a fourth input terminal, and an output terminal configured to output a differential amplified voltage; providing a first differential transistor pair including a first transistor of a first polarity having a gate connected to the third input terminal, and a second transistor of the first polarity having a gate connected to the fourth input terminal; providing a second differential transistor pair including a third transistor of a second polarity having a gate connected to the third input terminal, and a fourth transistor of the second polarity having a gate connected to the fourth input terminal; providing first to sixth current mirror circuits; connecting the second, third, fifth, and sixth current mirror circuits to an output terminal; supplying a first predetermined constant current to the first differential transistor pair; supplying a second predetermined constant current to the second differential transistor pair; inputting the first power supply voltage in first, second, and sixth current mirror circuits; inputting the second power supply voltage in third, fourth, and fifth current mirror circuits; causing the first current mirror circuit to output a current approximately equal or proportional in amount to a current flowing through the first transistor; causing the second current mirror circuit to output a current approximately equal or proportional in amount to a current flowing through the second transistor; causing the third current mirror circuit to output a current input from the first current mirror circuit; causing the fourth current mirror circuit to output a current approximately equal or proportional in amount to a current flowing through the third transistor; causing the fifth current mirror circuit to output a current approximately equal or proportional in amount to a current flowing through the fourth transistor; and causing the sixth current mirror circuit to output a current input from the fourth current mirror circuit.

The differential amplifying method may further include: providing a reference voltage source, a transistor of the first polarity, and a current mirror circuit; connecting a source of the transistor of the first polarity to respective sources of the first and second transistors; connecting an input terminal of the current mirror circuit to a drain of the transistor of the first polarity; connecting an output terminal of the current mirror circuit to a connection point connecting respective sources of the third and fourth transistors; inputting the first power supply voltage in the current mirror circuit; and causing the reference voltage source to generate and input a predetermined reference voltage in a gate of the transistor of the first polarity.

The differential amplifying method may further include setting the predetermined reference voltage output from the reference voltage source to be within a range of voltages input in the third and fourth input terminals to pass currents through each of the first and second differential transistor pairs.

BRIEF DESCRIPTION OF THE DRAWINGS

A more complete appreciation of the disclosure and many of the advantages thereof are readily obtained as the same becomes better understood by reference to the following detailed description when considered in connection with the accompanying drawings, wherein.

DETAILED DESCRIPTION OF PREFERRED EMBODIMENTS

Figure 1:
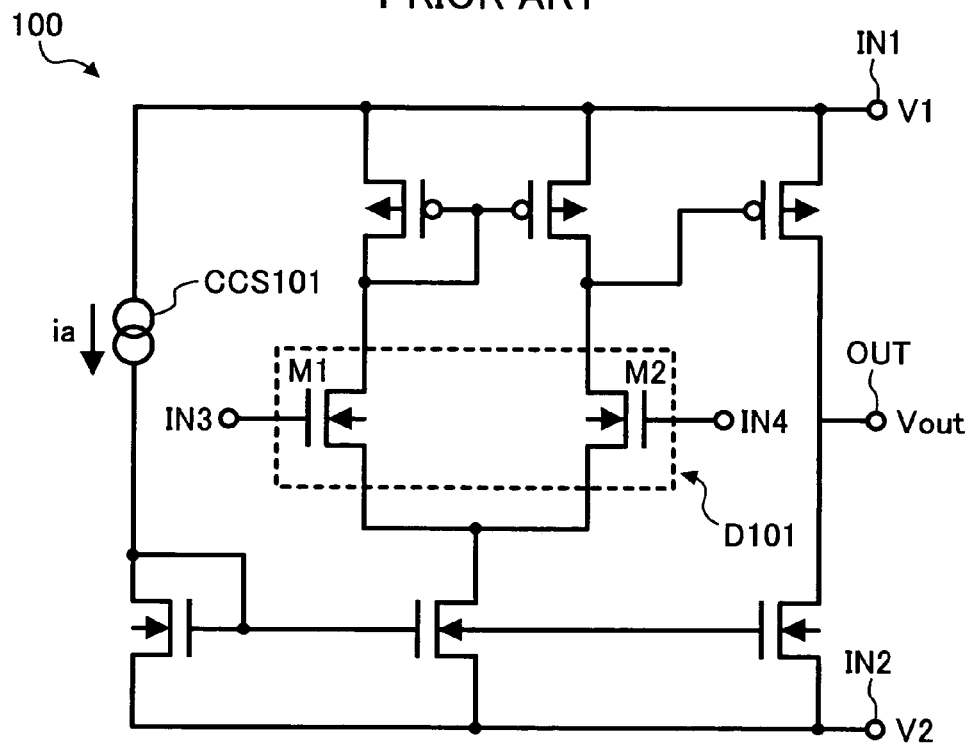
FIG. 1 is a circuit diagram illustrating a configuration of a background differential amplifier circuit.
Figure 2:
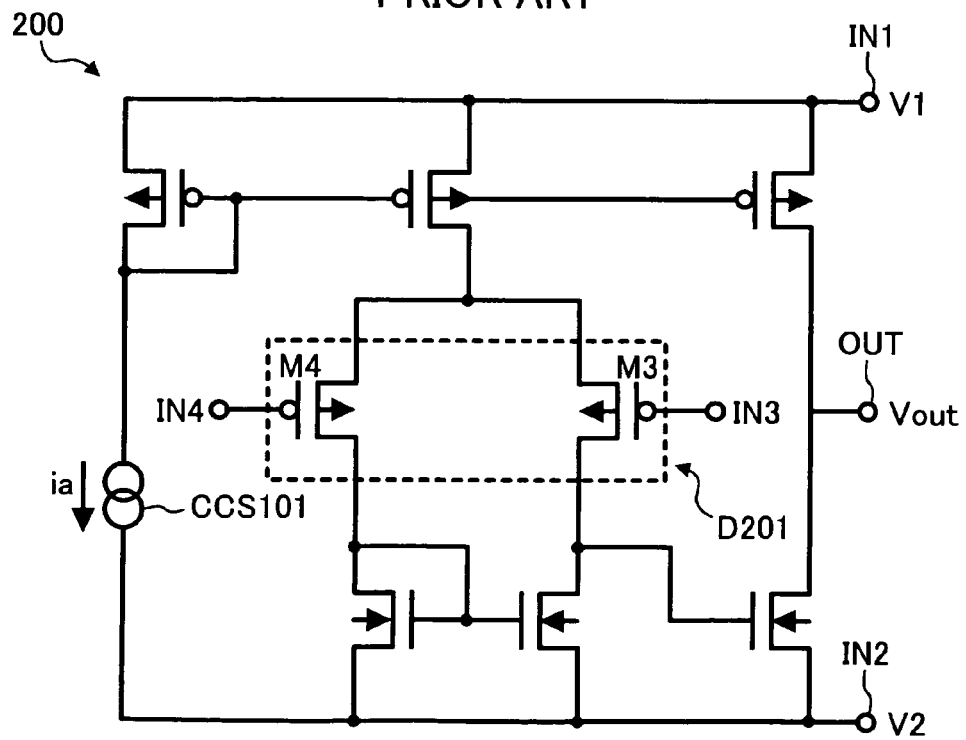
FIG. 2 is a circuit diagram illustrating a configuration of another background differential amplifier circuit.

In describing preferred embodiments illustrated in the drawings, specific terminology is employed for the purpose of clarity. However, the disclosure of this patent specification is not intended to be limited to the specific terminology so used and it is to be understood that substitutions for each specific element can include any technical equivalents that operate in a similar manner.

Figure 3:
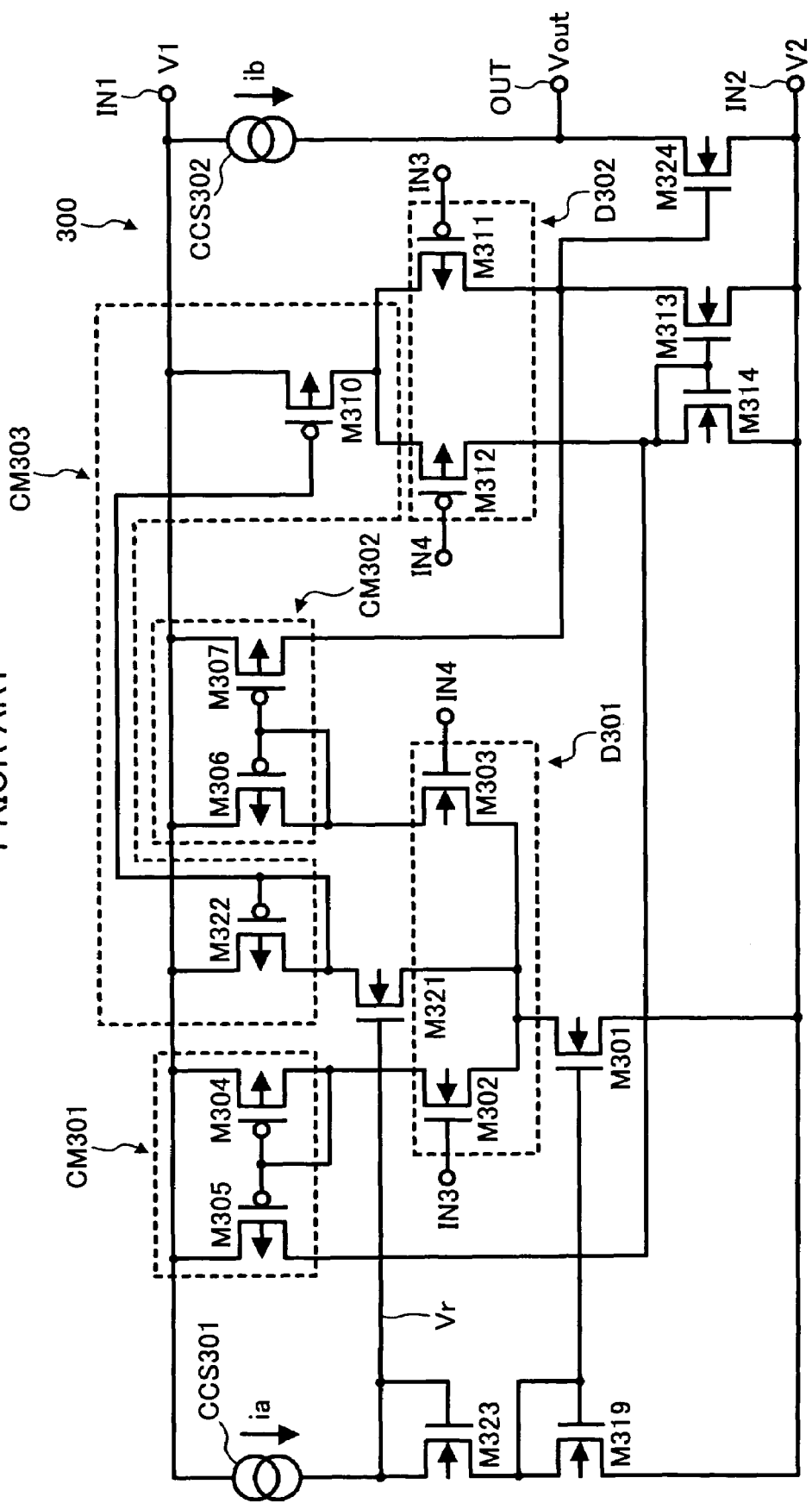
FIG. 3 is a circuit diagram illustrating a configuration of still another background differential amplifier circuit.
Figure 4:
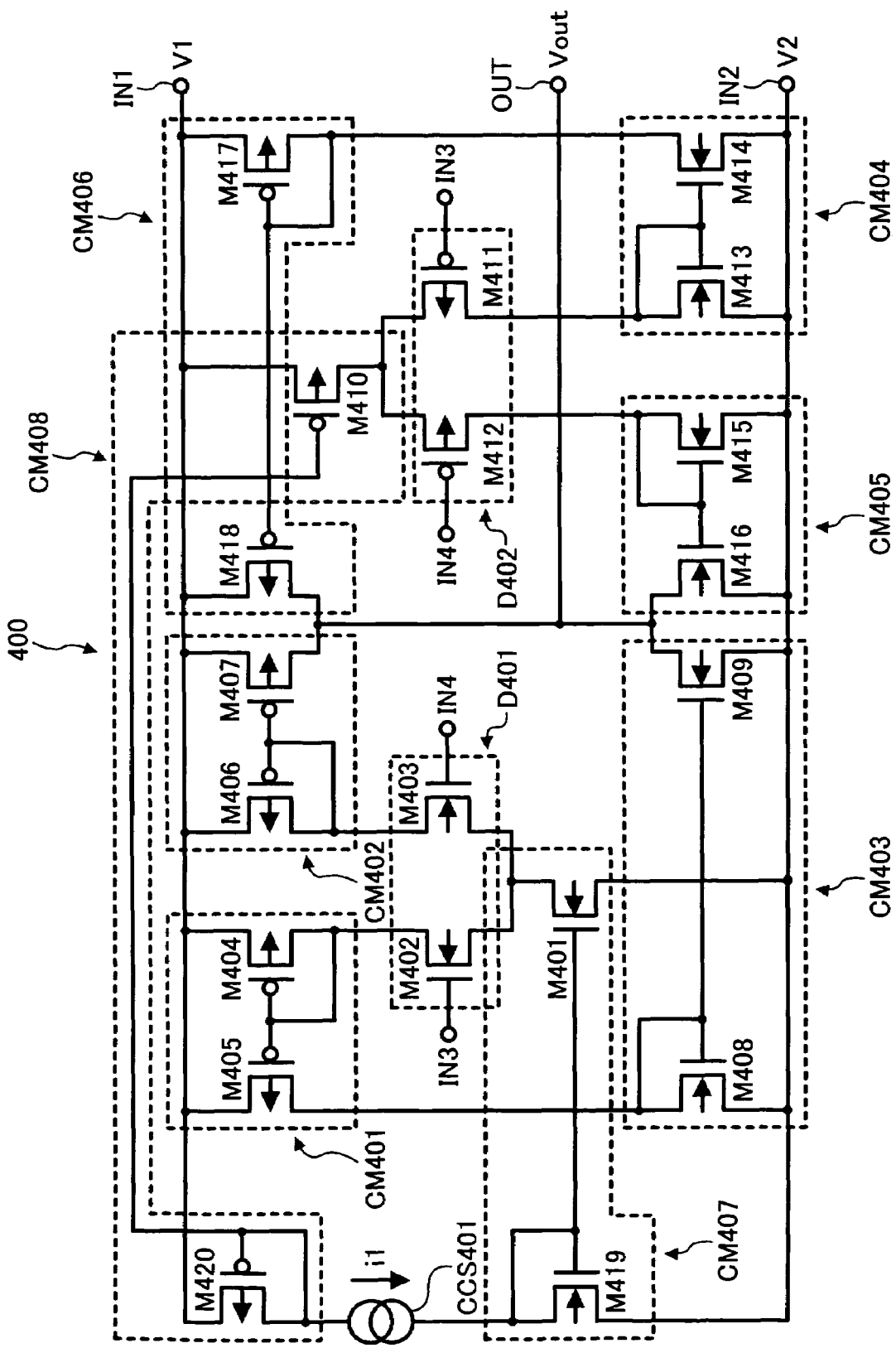
FIG. 4 is a circuit diagram illustrating a configuration of a differential amplifier circuit according to an embodiment.

Referring now to the drawings, wherein like reference numerals designate identical or corresponding parts throughout the several views, FIG. 4 illustrates a configuration of a differential amplifier circuit 400 according to an embodiment. In the following discussion, description is omitted for components of the differential amplifier circuit 400 which are also components of the background differential amplifier circuit 300 of FIG. 3.

As illustrated in FIG. 4, the present differential amplifier circuit 400 includes a differential transistor pair D401 formed by two NMOS transistors M402 and M403, a differential transistor pair D402 formed by two PMOS transistors M411 and M412, first to eighth current mirror circuits CM401 to CM408, and a constant current source CCS401 for supplying a predetermined constant current i1. The NMOS transistor M402 of the differential transistor pair D401 and the PMOS transistor M411 of the differential transistor pair D402 are respectively connected to the input terminal IN3. Meanwhile, the NMOS transistor M403 of the differential transistor pair D401 and the PMOS transistor M412 of the differential transistor pair D402 are respectively connected to the input terminal IN4.

The first current mirror circuit CM401 includes PMOS transistors M404 and M405, the second current mirror circuit CM402 includes PMOS transistors M406 and M407, the third current mirror circuit CM403 includes NMOS transistors M408 and M409, the fourth current mirror circuit CM404 includes NMOS transistors M413 and M414, the fifth current mirror circuit CM405 includes NMOS transistors M415 and M416, the sixth current mirror circuit CM406 includes PMOS transistors M417 and M418, the seventh current mirror circuit CM407 includes NMOS transistors M401 and M419, and the eighth current mirror circuit CM408 includes PMOS transistors M410 and M420.

In the differential transistor pair D401, a gate of the NMOS transistor M402 is connected to the input terminal IN3, and a gate of the NMOS transistor M403 is connected to the input terminal IN4. A drain of the NMOS transistor M402 is connected to a drain of the PMOS transistor M404, which forms an input terminal of the first current mirror circuit CM401.

In the first current mirror circuit CM401, each of the PMOS transistors M404 and M405 has a source connected to the input terminal IN1 to receive the high-potential power supply voltage V1. A gate of the PMOS transistor M404 is connected to a gate of the PMOS transistor M405, and a connection point between the gates of the PMOS transistors M404 and M405 is connected to the drain of the PMOS transistor M404. A drain of the PMOS transistor M405, which forms an output terminal of the first current mirror circuit CM401, is connected to a drain of the NMOS transistor M408, which forms an input terminal of the third current mirror circuit CM403.

In the second current mirror circuit CM402, each of the PMOS transistors M406 and M407 has a source connected to the input terminal IN1 to receive the high-potential power supply voltage V1. A gate of the PMOS transistor M406 is connected to a gate of the PMOS transistor M407, and a connection point between the gates of the PMOS transistors M406 and M407 is connected to a drain of the PMOS transistor M406. A drain of the PMOS transistor M407, which forms an output terminal of the second current mirror circuit CM402, is connected to a drain of the NMOS transistor M409, which forms an output terminal of the third current mirror circuit CM403.

In the third current mirror circuit CM403, each of the NMOS transistors M408 and M409 has a source connected to the input terminal IN2 to receive the low-potential power supply voltage V2. A gate of the NMOS transistor M408 is connected to a gate of the NMOS transistor M409, and a connection point between the gates of the NMOS transistors M408 and M409 is connected to a drain of the NMOS transistor M408.

In the differential transistor pair D402, on the other hand, a gate of the PMOS transistor M411 is connected to the input terminal IN3, and a gate of the PMOS transistor M412 is connected to the input terminal IN4. A drain of the PMOS transistor M411 is connected to a drain of the NMOS transistor M413, which forms an input terminal of the fourth current mirror circuit CM404.

In the fourth current mirror circuit CM404, each of the NMOS transistors M413 and M414 has a source connected to the input terminal IN2 to receive the low-potential power supply voltage V2. A gate of the NMOS transistor M413 is connected to a gate of the NMOS transistor M414, and a connection point between the gates of the NMOS transistors M413 and M414 is connected to the drain of the NMOS transistor M413. A drain of the NMOS transistor M414, which forms an output terminal of the fourth current mirror circuit CM404, is connected to a drain of the PMOS transistor M417, which forms an input terminal of the sixth current mirror circuit CM406.

In the fifth current mirror circuit CM405, each of the NMOS transistors M415 and M416 has a source connected to the input terminal IN2 to receive the low-potential power supply voltage V2. A gate of the NMOS transistor M415 is connected to a gate of the NMOS transistor M416, and a connection point between the gates of the NMOS transistors M415 and M416 is connected to a drain of the NMOS transistor M415. A drain of the NMOS transistor M416, which forms an output terminal of the fifth current mirror circuit CM405, is connected to the drain of the PMOS transistor M407, which forms the output terminal of the second current mirror circuit CM402, to the drain of the NMOS transistor M409, which forms the output terminal of the third current mirror circuit CM403, and to a drain of the PMOS transistor M418, which forms an output terminal of the sixth current mirror circuit CM406. A connection point between the drain of the PMOS transistor M407 and the drain of the PMOS transistor M418 is connected to another connection point between the drain of the NMOS transistor M409 and the drain of the NMOS transistor M416, so as to be connected to the output terminal OUT, which is the output terminal of the differential amplifier circuit 400.

In the sixth current mirror circuit CM406, each of the PMOS transistors M417 and M418 has a source connected to the input terminal IN1 to receive the high-potential power supply voltage V1. A gate of the PMOS transistor M417 is connected to a gate of the PMOS transistor M418, and a connection point between the gates of the PMOS transistors M417 and M418 is connected to the drain of the PMOS transistor M417.

In the seventh current mirror circuit CM407, each of the NMOS transistors M401 and M419 has a source connected to the input terminal IN2 to receive the low-potential power supply voltage V2. A gate of the NMOS transistor M401 is connected to a gate of the NMOS transistor M419, and a connection point between the gates of the NMOS transistors M401 and M419 is connected to a drain of the NMOS transistor M419. A drain of the NMOS transistor M401, which forms an output terminal of the seventh current mirror circuit CM407, is connected to a source of the NMOS transistor M402 and a source of the NMOS transistor M403. Further, the seventh current mirror circuit CM407 and the constant current source CCS401 form a first constant current source for supplying a constant current to each of the NMOS transistors M402 and M403 of the differential transistor pair D401.

In the eighth current mirror circuit CM408, each of the PMOS transistors M410 and M420 has a source connected to the input terminal IN1 to receive the high-potential power supply voltage V1. A gate of the PMOS transistor M410 is connected to a gate of the PMOS transistor M420, and a connection point between the gates of the PMOS transistors M410 and M420 is connected to a drain of the PMOS transistor M420. A drain of the PMOS transistor M410, which forms an output terminal of the eighth current mirror circuit CM408, is connected to a source of the PMOS transistor M411 and a source of the PMOS transistor M412. Further, the eighth current mirror circuit CM408 and the constant current source CCS401 form a second constant current source for supplying a constant current to each of the PMOS transistors M411 and M412 of the differential transistor pair D402. The constant current source CCS401 for supplying the predetermined constant current il is connected between the drain of the PMOS transistor M420, which forms an input terminal of the eighth current mirror circuit CM408, and the drain of the NMOS transistor M419, which forms an input terminal of the seventh current mirror circuit CM407.

In the differential amplifier circuit 400 thus configured, when the input common mode voltage is close to the low-potential power supply voltage V2, respective gate-source voltages of the NMOS transistors M402 and M403 are decreased to be lower than respective threshold values. As a result, the NMOS transistors M402 and M403 of the differential transistor pair D401 are turned off, so that the PMOS transistor M407 and the NMOS transistor M409 are also turned off.

Meanwhile, even when the input common mode voltage is close to the low-potential power supply voltage V2, the PMOS transistors M411 and M412 are operable. Therefore, a half of the constant current il flows into the PMOS transistor M411 to be output from the corresponding PMOS transistor M418, while the other half of the constant current il flows into the PMOS transistors M412 to be output from the corresponding NMOS transistor M416. The differential amplifier circuit 400 is thus normally operated.

When the input common mode voltage increases, a current starts to flow into each of the NMOS transistors M402 and M403. If the input common mode voltage is not sufficiently increased, however, the current flowing into each of the NMOS transistors M402 and M403 does not reach the half amount of the constant current il. A current approximately equal or proportional in amount to the current flowing through the NMOS transistor M402 is output from the NMOS transistor M409, while a current approximately equal or proportional in amount to the current flowing through the NMOS transistor M403 is output from the PMOS transistor M407. These currents are combined with a current output from the NMOS transistor M416 and a current output from the PMOS transistor M418 to be output from the output terminal OUT.

When the input common mode voltage is further increased, the current flowing in each of the NMOS transistors M402 and M403 reaches the half amount of the constant current il. Then, the current approximately equal or proportional in amount to the current flowing through the NMOS transistor M402 is output from the NMOS transistor M409, while the current approximately equal or proportional in amount to the current flowing through the NMOS transistor M403 is output from the PMOS transistor M407.

When the input common mode voltage is still further increased so that the respective gate-source voltages of the PMOS transistors M411 and M412 approach respective threshold values, each of the current flowed in the PMOS transistor M411 and the current flowed in the PMOS transistor M412 is decreased to be smaller in amount than the half of the constant current il.

If the input common mode voltage is still yet further increased, the PMOS transistors M411 and M412 are turned off. In this state, the input common mode voltage is within a voltage range in which the NMOS transistors M402 and M403 are operable. Therefore, the half amount of the constant current il flows into each of the NMOS transistors M402 and M403, and a current according to the half amount of the constant current il is output from each of the NMOS transistor M409 and the PMOS transistor M407. The differential amplifier circuit 400 is thus normally operated.

In this manner, the differential amplifier circuit 400 of FIG. 4 is normally operated in response to the input common mode voltage in a range from the low-potential power supply voltage V2 to the high-potential power supply voltage V1. Further, the differential amplifier circuit 400 is operable at a voltage in a relatively wide range from a voltage approximately 0.1 volt higher than the low-potential power supply voltage V2 to a voltage approximately 0.1 volt lower than the high-potential power supply voltage V1. The differential amplifier circuit 400 is driven by the constant current il both at the rise and the fall of the output voltage Vout. Therefore, it is possible to equalize the length of rise time of the output voltage Vout with the length of fall time of the output voltage Vout. Furthermore, all of the transistors included in the differential amplifier circuit 400 are operated by the constant current. Therefore, in an operating state, variation in voltage is relatively small at each of connection points of transistors, except at the input terminals IN1 and IN2 and the output terminal OUT. Accordingly, a delay time caused by parasitic capacitance can be reduced, and the differential amplifier circuit 400 can operate at a relatively fast speed.

Figure 5:
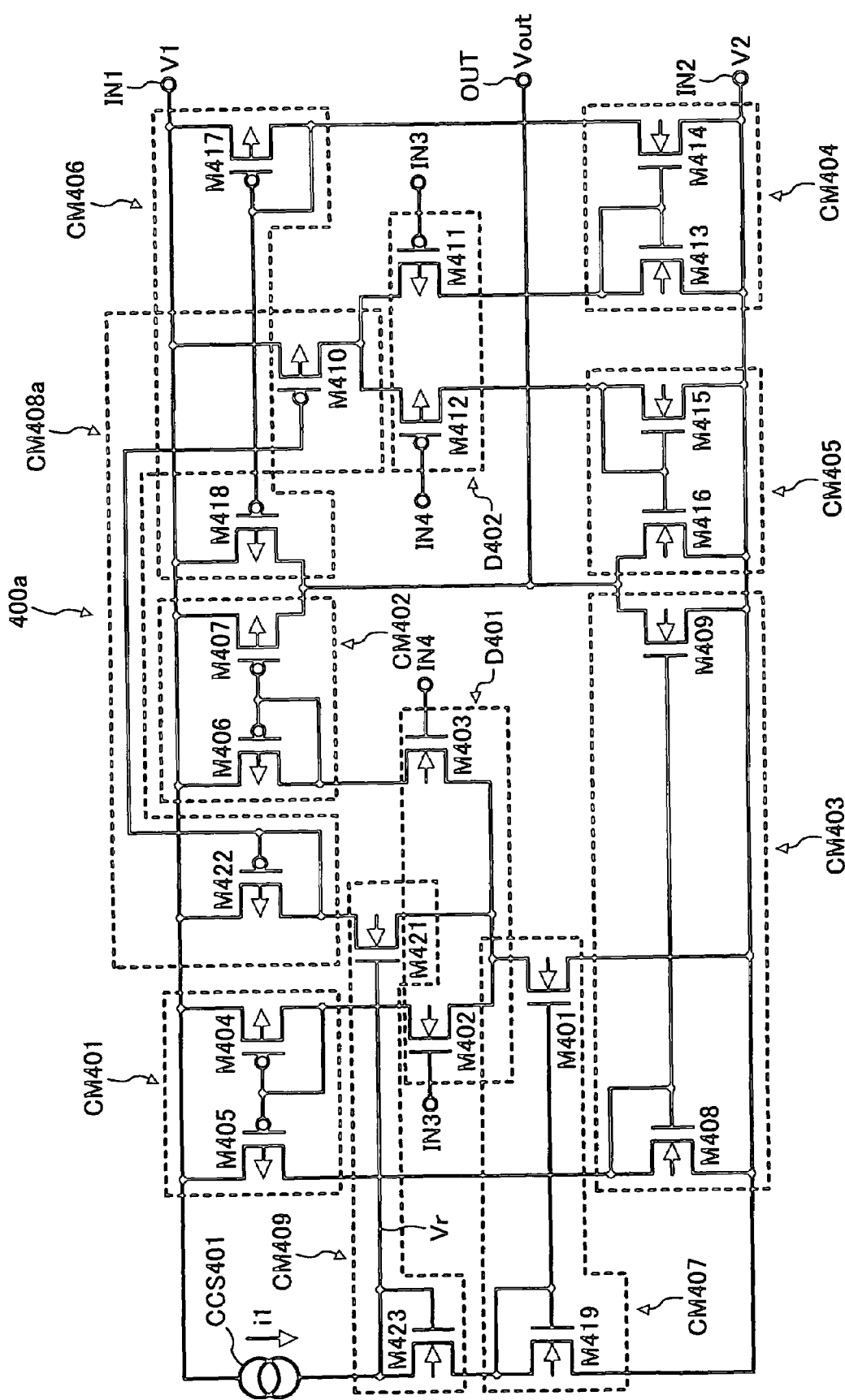
FIG. 5 is a circuit diagram illustrating a configuration of a differential amplifier circuit according to another embodiment.

With reference to FIG. 5, a differential-amplifier circuit 400a according to another embodiment is described. Description is omitted for components of the differential amplifier circuit 400a which are also components of the differential amplifier circuit 400 of FIG. 4. Therefore, differences between the differential amplifier circuit 400 and the differential amplifier circuit 400a are described.

The differential amplifier circuit 400a is different from the differential amplifier circuit 400 in the following points. First, the differential amplifier circuit 400a is provided with an NMOS transistor M421 having a source connected to the connection point between the sources of the NMOS transistors M402 and M403 and a gate for receiving input of the predetermined reference voltage Vr. Second, in the differential amplifier circuit 400a, the eighth current mirror circuit CM408 of the differential amplifier circuit 400 of FIG. 4 is replaced by a current mirror circuit CM408a including a PMOS transistor M422 and the PMOS transistor M410, so that a constant current flowed in the NMOS transistor M421 is supplied via the current mirror circuit CM408a to each of the PMOS transistors M411 and M412 of the differential transistor pair D402.

The differential amplifier circuit 400a of FIG. 5 includes the differential transistor pair D401 formed by the NMOS transistors M402 and M403, the differential transistor pair D402 formed by the PMOS transistors M411 and M412, the first to ninth current mirror circuits CM401 to CM407, CM408a, and CM409, and the constant current source CCS401.

The eighth current mirror circuit CM408a includes the PMOS transistors M410 and M422, and the ninth current mirror circuit CM409 includes NMOS transistors M421 and M423. In the differential amplifier circuit 400a, the seventh current mirror circuit CM407 and the constant current source CCS401 form the first constant current source, and the eighth and ninth current mirror circuits CM408a and CM409 and the constant current source CCS401 form the second constant current source. Further, the constant current source CCS401 and the NMOS transistor M423 form a reference voltage source.

In the eighth current mirror circuit CM408a, each of the PMOS transistors M410 and M422 has a source connected to the input terminal IN1 to receive the high-potential power supply voltage V1. The gate of the PMOS transistor M410 is connected to a gate of the PMOS transistor M422, and a connection point between the gates of the PMOS transistors M410 and M422 is connected to a drain of the PMOS transistor M422. The drain of the PMOS transistor M410, which forms an output terminal of the eighth current mirror circuit CM408a, is connected to the source of the PMOS transistor M411 and the source of the PMOS transistor M412. Further, the eighth and ninth current mirror circuits CM408a and CM409 and the constant current source CCS401 form the second constant current source for supplying a constant current to each of the PMOS transistors M411 and M412 of the differential transistor pair D402.

The source of the PMOS transistor M422, which forms an input terminal of the eighth current mirror circuit CM408a, is connected to the input terminal IN1 to receive the high-potential power supply voltage V1, and the drain of the PMOS transistor M422 is connected to a drain of the NMOS transistor M421.

The drain of the NMOS transistor M421, which forms an output terminal of the ninth current mirror circuit CM409, is connected to the drain of the PMOS transistor M422, which forms the input terminal of the eighth current mirror circuit CM408a. The source of the NMOS transistor M421 is connected to the drain of the NMOS transistor M401. A gate of the NMOS transistor M421 is connected to a gate of the NMOS transistor M423, and a connection point between the gates of the NMOS transistors M421 and M423 is connected to a drain of the NMOS transistor M423. The drain of the NMOS transistor M423, which forms an input terminal of the ninth current mirror circuit CM409, receives input of the constant current i1 output from the constant current source CCS401, and a source of the NMOS transistor M423 is connected to the drain of the NMOS transistor M419.

Figure 6A:
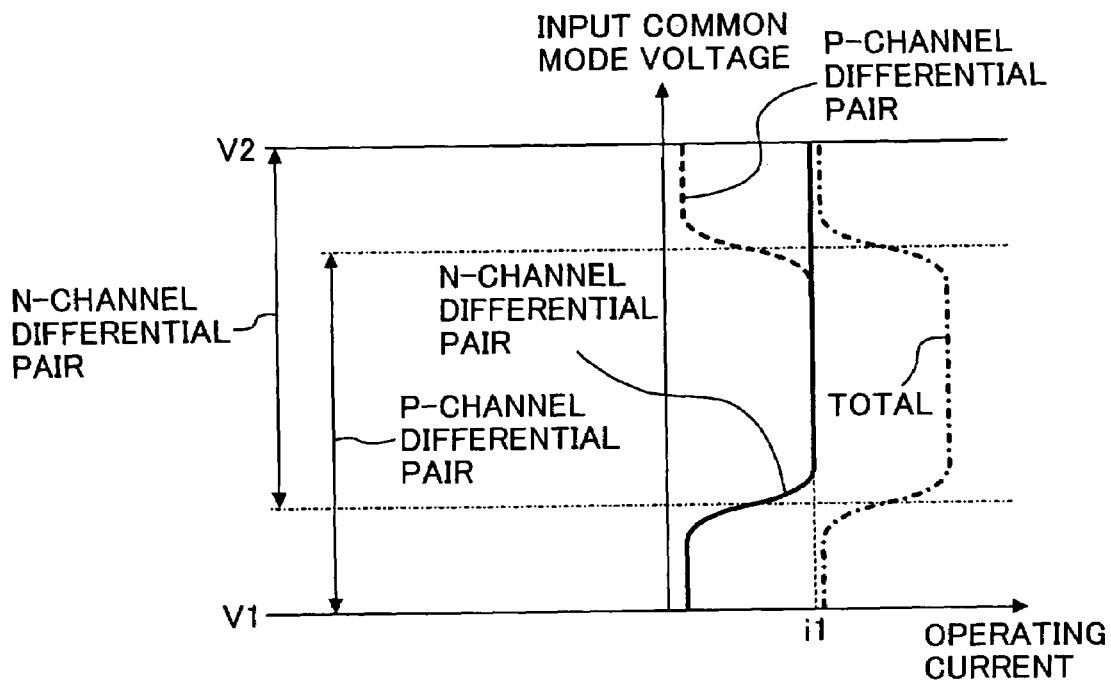
FIG. 6A is a chart illustrating a relationship between an operating current and an input common mode voltage observed in each of the differential transistor pairs used in FIG. 4.
Figure 6B:
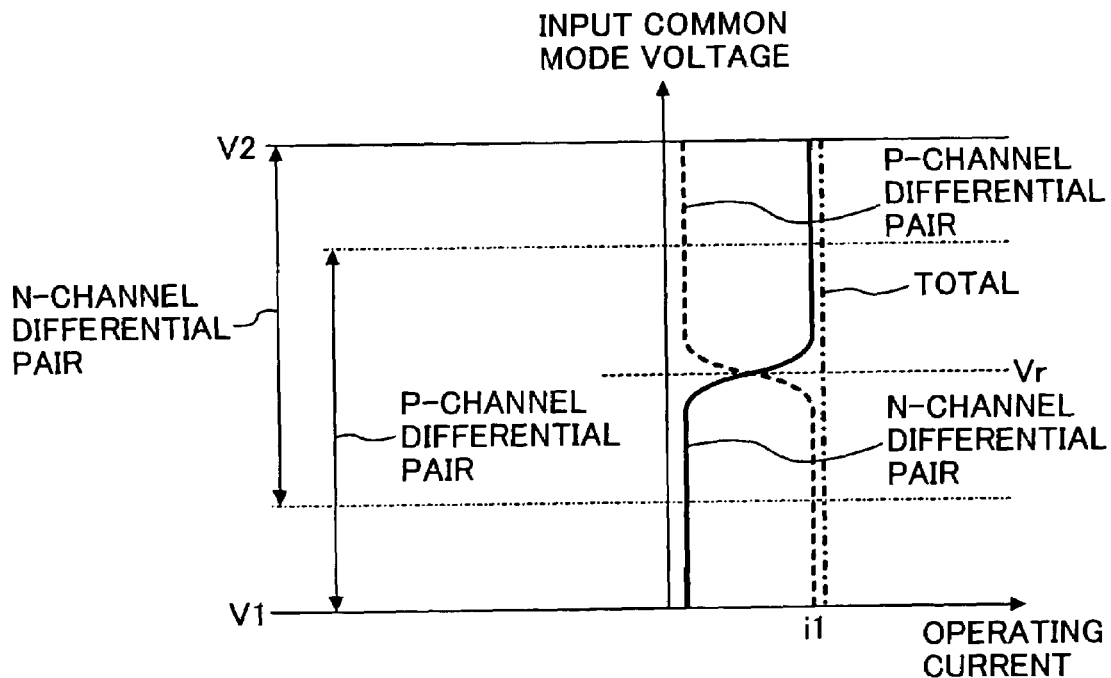
FIG. 6B is a chart illustrating a relationship between an operating current and an input common mode voltage observed in each of the differential transistor pairs used in FIG. 5.

With reference to FIGS. 6A and 6B, description is made on an exemplary relationship between an operating current and the input common mode voltage observed in each of the differential transistor pairs used in the differential amplifier circuits 400 and 400a. The chart of FIG. 6A indicates a relationship between the operating current and the input common mode voltage observed in the differential amplifier circuit 400 of FIG. 4. Meanwhile, the chart of FIG. 6B indicates a relationship between the operating current and the input common mode voltage observed in the differential amplifier circuit 400a of FIG. 5. In each of FIGS. 6A and 6B, a solid line indicates an operating current for the differential transistor pair D401 including the NMOS transistors M402 and M403, while a dotted line indicates an operating current for the differential transistor pair D402 including the PMOS transistors M411 and M412. Further, a dot-dashed line indicates a total operating current for the differential transistor pairs D401 and D402.

As illustrated in FIG. 6A, in a case of the differential amplifier circuit 400 of FIG. 4, when the input common mode voltage is close to either the low-potential power supply voltage V2 or the high-potential power supply voltage V1, either one of the two differential transistor pairs D401 and D402 is turned off. As a result, the total operating current is equalized with the constant current i1 which flows in the NMOS transistor M401 or the PMOS transistor M410. On the other hand, when the input common mode voltage is in an intermediate range between the low-potential power supply voltage V2 and the high-potential power supply voltage V1, both of the two differential transistor pairs D401 and D402 are in an operating state. Therefore, the total operating current is equalized with a sum of a constant current supplied from the NMOS transistor M401 and a constant current supplied from the PMOS transistor M410, i.e., a double amount of the constant current i1.

Meanwhile, as illustrated in FIG. 6B, in a case of the differential amplifier circuit 400a of FIG. 5, when the input common mode voltage is lower than the reference voltage Vr, both of the NMOS transistors M402 and M403 are turned off. However, the constant current i1 flowed in the NMOS transistor M401 flows in the NMOS transistor M421, and the eighth current mirror circuit CM408a allows the PMOS transistor M410 to output the constant current i1. As a result, the total operating current is equalized with the constant current i1. Further, when the input common mode voltage is higher than the reference voltage Vr, the constant current i1 supplied from the NMOS transistor M401 is divided into halves, so that a half of the constant current i1 flows in the NMOS transistor M402 and the other half of the constant current i1 flows in the NMOS transistor M403. As a result, the NMOS transistor M421 is turned off, and the PMOS transistor M410 is also turned off. Accordingly, the total operating current becomes equal to the constant current i1, which is the operating current for the differential transistor pair D401 including the NMOS transistors M402 and M403.

As described above, the differential amplifier circuits according to the above embodiments can stabilize the current used for driving the output terminal OUT with the input common mode voltage within the range from the low-potential power supply voltage V2 to the high-potential power supply voltage V1. Accordingly, the rise time and the fall time of the output voltage Vout can be stabilized within the input common mode voltage range from the low-potential power supply voltage V2 to the high-potential power supply voltage V1.

The above-described embodiments are illustrative, and numerous additional modifications and variations are possible in light of the above teachings. For example, elements and/or features of different illustrative and exemplary embodiments herein may be combined with each other and/or substituted for each other within the scope of this disclosure and appended claims. It is therefore to be understood that within the scope of the appended claims, the disclosure of this patent specification may be practiced otherwise than as specifically described herein.

This patent specification is based on Japanese patent application No. 2004-116766 filed on Apr. 12, 2004 in the Japan Patent Office, the entire contents of which are incorporated by reference herein.

What is claimed is:

1. A differential amplifying apparatus comprising:

a first differential transistor pair including two transistors of a first polarity configured to be operated by a first predetermined constant current;

a second differential transistor pair including two transistors of a second polarity configured to be operated by a second predetermined constant current;

a first current mirror circuit configured to receive a first power supply voltage and output a current approximately equal or proportional in amount to a current flowing through one transistor of the first differential transistor pair;

a second current mirror circuit configured to be connected to an output terminal, receive the first power supply voltage, and output a current approximately equal or proportional in amount to a current flowing through the other transistor of the first differential transistor pair;

a third current mirror circuit configured to be connected to the output terminal, receive a second power supply voltage, and output a current input from the first current mirror circuit;

a fourth current mirror circuit configured to receive the second power supply voltage and output a current approximately equal or proportional in amount to a current flowing through one transistor of the second differential transistor pair;

a fifth current mirror circuit configured to be connected to the output terminal, receive the second power supply voltage, and output a current approximately equal or proportional in amount to a current flowing through the other transistor of the second differential transistor pair; and a sixth current mirror circuit configured to be connected to the output terminal, receive the first power supply voltage, and output a current input from the fourth current mirror circuit.

2. The differential amplifying apparatus of claim 1, wherein the differential amplifying apparatus operates in a range from approximately the first power supply voltage to approximately the second power supply voltage, and the range does not vary according to an input voltage of the differential amplifying apparatus.

3. The differential amplifying apparatus of claim 1, wherein a rise time of an output voltage of the differential amplifying apparatus is approximately equal to a fall time of the output voltage.

4. A differential amplifying apparatus comprising:

a first input terminal configured to receive a first power supply voltage;

a second input terminal configured to receive a second power supply voltage;

a third input terminal;

a fourth input terminal;

an output terminal configured to output a differential amplified voltage;

a first differential transistor pair configured to be operated by a first predetermined constant current, comprising:

a first transistor of a first polarity having a gate connected to the third input terminal, and a second transistor of the first polarity having a gate connected to the fourth input terminal;

a second differential transistor pair configured to be operated by a second predetermined constant current, comprising:

a third transistor of a second polarity having a gate connected to the third input terminal, and a fourth transistor of the second polarity having a gate connected to the fourth input terminal;

a first current mirror circuit configured to receive the first power supply voltage and output a current approximately equal or proportional in amount to a current flowing through the first transistor;

a second current mirror circuit configured to be connected to the output terminal, receive the first power supply voltage, and output a current approximately equal or proportional in amount to a current flowing through the second transistor;

a third current mirror circuit configured to be connected to the output terminal, receive the second power supply voltage, and output a current input from the first current mirror circuit;

a fourth current mirror circuit configured to receive the second power supply voltage and output a current approximately equal or proportional in amount to a current flowing through the third transistor;

a fifth current mirror circuit configured to be connected to the output terminal, receive the second power supply voltage, and output a current approximately equal or proportional in amount to a current flowing through the fourth transistor; and a sixth current mirror circuit configured to be connected to the output terminal, receive the first power supply voltage, and output a current input from the fourth current mirror circuit.

5. The differential amplifying apparatus as described in claim 4, further comprising a second constant current source comprising:

a reference voltage source configured to generate and output a predetermined reference voltage;

a transistor of the first polarity comprising:

a gate configured to receive the predetermined reference voltage, and a source connected to respective sources of the first and second transistors; and a current mirror circuit configured to receive the first power supply voltage, comprising:

an input terminal connected to a drain of the transistor of the first polarity, and an output terminal connected to a connection point connecting respective sources of the third and fourth transistors.

6. The differential amplifying apparatus as described in claim 5, wherein the predetermined reference voltage output from the reference voltage source is set to be within a range of voltages input in the third and fourth input terminals to pass currents through each of the first and second differential transistor pairs.

7. The differential amplifying apparatus of claim 4, wherein the differential amplifying apparatus operates in a range from approximately the first power supply voltage to approximately the second power supply voltage, and the range does not vary according to an input voltage of the differential amplifying apparatus.

8. The differential amplifying apparatus of claim 4, wherein a rise time of the output differential amplified voltage is approximately equal to a fall time of the differential amplified voltage.

9. The differential amplifying apparatus of claim 5, wherein a total operating current is substantially constant and is approximately equal to the first predetermined constant current.

10. A differential amplifying apparatus comprising:
first differential means including two transistors of a first polarity configured to be operated by a first predetermined constant current;
second differential means including two transistors of a second polarity configured to be operated by a second predetermined constant current;
first mirror current generating means for receiving a first power supply voltage and outputting a current approximately equal or proportional in amount to a current flowing through one transistor of the first differential means;
second mirror current generating means connected to an output terminal for receiving the first power supply voltage and outputting a current approximately equal or proportional in amount to a current flowing through the other transistor of the first differential means;
third mirror current generating means connected to the output terminal for receiving a second power supply voltage and outputting a current input from the first mirror current generating means;
fourth mirror current generating means for receiving the second power supply voltage and outputting a current approximately equal or proportional in amount to a current flowing through one transistor of the second differential means;
fifth mirror current generating means connected to the output terminal for receiving the second power supply voltage and outputting a current approximately equal or proportional in amount to a current flowing through the other transistor of the second differential means; and
sixth mirror current generating means connected to the output terminal for receiving the first power supply voltage and outputting a current input from the fourth mirror current generating means.

11. A differential amplifying apparatus comprising:
first input terminal means for receiving a first power supply voltage;
second input terminal means for receiving a second power supply voltage;
third input terminal means;
fourth input terminal means;
output terminal means for outputting a differential amplified voltage;
first differential means operated by a first predetermined constant current, comprising:
a first transistor of a first polarity having a gate connected to the third input terminal means, and
a second transistor of the first polarity having a gate connected to the fourth input terminal means;
second differential means operated by a second predetermined constant current, comprising:
a third transistor of a second polarity having a gate connected to the third input terminal means, and
a fourth transistor of the second polarity having a gate connected to the fourth input terminal means;
first mirror current generating means for receiving the first power supply voltage and outputting a current approximately equal or proportional in amount to a current flowing through the first transistor;
second mirror current generating means connected to the output terminal means for receiving the first power supply voltage and outputting a current approximately equal or proportional in amount to a current flowing through the second transistor;
third mirror current generating means connected to the output terminal means for receiving the second power supply voltage and outputting a current input from the first mirror current generating means;
fourth mirror current generating means for receiving the second power supply voltage and outputting a current approximately equal or proportional in amount to a current flowing through the third transistor;
fifth mirror current generating means connected to the output terminal means for receiving the second power supply voltage and outputting a current approximately equal or proportional in amount to a current flowing through the fourth transistor; and
sixth mirror current generating means connected to the output terminal means for receiving the first power supply voltage and outputting a current input from the fourth mirror current generating means.

12. The differential amplifying apparatus as described in claim 11, further comprising a second constant current source means comprising:
reference voltage source means for generating and outputting a predetermined reference voltage;
a transistor of the first polarity comprising:
a gate configured to receive the predetermined reference voltage, and
a source connected to respective sources of the first and second transistors; and
mirror current generating means for receiving the first power supply voltage, comprising:
an input terminal connected to a drain of the transistor of the first polarity; and
an output terminal connected to a connection point connecting respective sources of the third and fourth transistors.

13. The differential amplifying apparatus as described in claim 12, wherein the predetermined reference voltage output from the reference voltage source means is set to be within a range of voltages input in the third and fourth input terminals to pass currents through each of the first and second differential means.

14. A differential amplifying method comprising:
providing a first differential transistor pair including two transistors of a first polarity, and a second differential transistor pair including two transistors of a second polarity;
providing first to sixth current mirror circuits;
connecting the second, third, fifth, and sixth current mirror circuits to an output terminal;
supplying a first predetermined constant current to the first differential transistor pair;
supplying a second predetermined constant current to the second differential-transistor pair;
inputting a first power supply voltage in the first, second, and sixth current mirror circuits;
inputting a second power supply voltage in the third, fourth, and fifth current mirror circuits;
causing the first current mirror circuit to output a current approximately equal or proportional in amount to a current flowing through one transistor of the first differential transistor pair;

causing the second current mirror circuit to output a current approximately equal or proportional in amount to a current flowing through the other transistor of the first differential transistor pair;

causing the third current mirror circuit to output a current input from the first current mirror circuit;

causing the fourth current mirror circuit to output a current approximately equal or proportional in amount to a current flowing through one transistor of the second differential transistor pair;

causing the fifth current mirror circuit to output a current approximately equal or proportional in amount to a current flowing through the other transistor of the second differential transistor pair; and causing the sixth current mirror circuit to output a current input from the fourth current mirror circuit.

15. A differential amplifying method comprising:

providing a first input terminal configured to receive a first power supply voltage, a second input terminal configured to receive a second power supply voltage, a third input terminal, a fourth input terminal, and an output terminal configured to output a differential amplified voltage;

providing a first differential transistor pair including a first transistor of a first polarity having a gate connected to the third input terminal, and a second transistor of the first polarity having a gate connected to the fourth input terminal;

providing a second differential transistor pair including a third transistor of a second polarity having a gate connected to the third input terminal, and a fourth transistor of the second polarity having a gate connected to the fourth input terminal;

providing first to sixth current mirror circuits;

connecting the second, third, fifth, and sixth current mirror circuits to an output terminal;

supplying a first predetermined constant current to the first differential transistor pair;

supplying a second predetermined constant current to the second differential transistor pair;

inputting the first power supply voltage in first, second, and sixth current mirror circuits;

inputting the second power supply voltage in third, fourth, and fifth current mirror circuits;

causing the first current mirror circuit to output a current approximately equal or proportional in amount to a current flowing through the first transistor;

causing the second current mirror circuit to output a current approximately equal or proportional in amount to a current flowing through the second transistor;

causing the third current mirror circuit to output a current input from the first current mirror circuit;

causing the fourth current mirror circuit to output a current approximately equal or proportional in amount to a current flowing through the third transistor;

causing the fifth current mirror circuit to output a current approximately equal or proportional in amount to a current flowing through the fourth transistor; and causing the sixth current mirror circuit to output a current input from the fourth current mirror circuit.

16. The differential amplifying method as described in claim 15, further comprising:

providing a reference voltage source, a transistor of the first polarity, and a current mirror circuit;

connecting a source of the transistor of the first polarity to respective sources of the first and second transistors;

connecting an input terminal of the current mirror circuit to a drain of the transistor of the first polarity;

connecting an output terminal of the current mirror circuit to a connection point connecting respective sources of the third and fourth transistors;

inputting the first power supply voltage in the current mirror circuit; and causing the reference voltage source to generate and input a predetermined reference voltage in a gate of the transistor of the first polarity.

17. The differential amplifying method as described in claim 16, further comprising:

setting the predetermined reference voltage output from the reference voltage source to be within a range of voltages input in the third and fourth input terminals to pass currents through each of the first and second differential transistor pairs.

* * * * *